United States Patent
Choi et al.

(10) Patent No.: US 12,074,457 B2
(45) Date of Patent: Aug. 27, 2024

(54) ELECTRONIC DEVICE FOR WIRELESSLY TRANSMITTING POWER AND METHOD OF OPERATING THE SAME

(71) Applicant: SAMSUNG ELECTRONICS CO., LTD., Suwon-si (KR)

(72) Inventors: Bohwan Choi, Suwon-si (KR); Jinsu Choi, Suwon-si (KR); Sungbum Park, Suwon-si (KR); Kyungmin Lee, Suwon-si (KR); Sangwook Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 50 days.

(21) Appl. No.: 17/969,283

(22) Filed: Oct. 19, 2022

(65) Prior Publication Data
US 2023/0118967 A1    Apr. 20, 2023

Related U.S. Application Data

(63) Continuation of application No. PCT/KR2022/015814, filed on Oct. 18, 2022.

(30) Foreign Application Priority Data

Oct. 19, 2021    (KR) .................. 10-2021-0139595

(51) Int. Cl.
*H02J 50/60*    (2016.01)
*H02J 50/12*    (2016.01)

(52) U.S. Cl.
CPC .............. *H02J 50/60* (2016.02); *H02J 50/12* (2016.02)

(58) Field of Classification Search
CPC ......... B60L 53/124; H02J 50/10; H02J 50/12; H02J 50/60
See application file for complete search history.

(56) References Cited

U.S. PATENT DOCUMENTS

2012/0326524 A1* 12/2012 Matsumoto ........... H01M 10/46
                                                        307/104
2014/0266036 A1*  9/2014 Jung .................... B60L 53/124
                                                        320/108

(Continued)

FOREIGN PATENT DOCUMENTS

KR    10-2016-0143044 A    12/2016
KR    10-2017-0112389 A    10/2017

(Continued)

OTHER PUBLICATIONS

PCT International Search Report dated Jan. 23, 2023 for PCT/KR2022/015814.
PCT Written Opinion dated Jan. 27, 2023 for PCT/KR2022/015814.

*Primary Examiner* — Levi Gannon
(74) *Attorney, Agent, or Firm* — NIXON & VANDERHYE P.C.

(57) ABSTRACT

A first electronic device for wirelessly transmitting power may include a power transmission circuit, memory, a pulse generator, a foreign object detection circuit configured to detect a foreign object located in a path in which power is wirelessly transmitted through the power transmission circuit, and a control circuit. The control circuit may be configured to wirelessly transmit power to a second electronic device, based on an alternating current (AC) input voltage applied to the power transmission circuit, generate a trigger signal synchronized with a first time corresponding to a specified voltage of the input voltage through the pulse generator, store an output value of the foreign object detection circuit in the memory based on the trigger signal, the output value being identified at the first time, continuously obtain the output value stored in the memory from the memory during a specified time until before the trigger signal of a next period is received at the memory from the (Continued)

pulse generator, and detect the foreign object based on the output value obtained during the specified time.

20 Claims, 10 Drawing Sheets

(56) References Cited

U.S. PATENT DOCUMENTS

| | | |
|---|---|---|
| 2015/0198640 A1* | 7/2015 | Lee .................. H02J 50/60 |
| | | 320/108 |
| 2015/0372493 A1 | 12/2015 | Sankar |
| 2017/0005524 A1* | 1/2017 | Akuzawa ............ H02J 50/60 |
| 2017/0117755 A1 | 4/2017 | Muratov et al. |
| 2017/0288458 A1 | 10/2017 | Won et al. |
| 2018/0138756 A1 | 5/2018 | Ho |
| 2019/0052126 A1 | 2/2019 | Lee et al. |
| 2019/0385788 A1 | 12/2019 | Arisawa et al. |
| 2020/0161906 A1 | 5/2020 | Choi et al. |
| 2021/0281119 A1 | 9/2021 | Bhandarkar et al. |
| 2022/0247232 A1* | 8/2022 | Schwartz ............ H01F 27/361 |

FOREIGN PATENT DOCUMENTS

| | | |
|---|---|---|
| KR | 10-1890657 A | 8/2018 |
| KR | 10-2017-0020167 A | 2/2019 |
| KR | 10-2019-0017252 | 2/2019 |
| KR | 10-2020-0032907 | 3/2020 |
| KR | 10-2021-0032668 A | 3/2021 |
| WO | WO 2021/026466 A1 | 2/2021 |

* cited by examiner

ELECTRONIC DEVICE FOR WIRELESSLY TRANSMITTING POWER AND METHOD OF OPERATING THE SAME

CROSS REFERENCE TO RELATED APPLICATION

This application is a continuation of International Application No. PCT/KR2022/015814 designating the United States, filed on Oct. 18, 2022, in the Korean Intellectual Property Receiving Office and claiming priority to Korean Patent Application No. 10-2021-0139595 filed on Oct. 19, 2021, the disclosures of which are hereby incorporated herein by reference for all purposes as if fully set forth herein.

BACKGROUND

Field

Various embodiments relate to an electronic device for wirelessly transmitting power and/or a method of operating the same.

Description of Related Art

Along with the recent development of wireless charging technology, a method of charging various electronic devices by supplying power to them with a single charging device is being studied. This wireless charging technology is based on wireless power transmission and reception. For example, the battery of an electronic device may be automatically charged simply by placing the electronic device on a charging pad without connecting the electronic device through a separate charging connector.

Wireless charging techniques are largely classified into a coil-based electromagnetic induction scheme, a resonance scheme, and a radio frequency (RF)/microwave radiation scheme in which electrical energy is converted into microwaves and transmitted.

In a power transmission method by wireless charging, power is transmitted from a first coil of a transmitting end to a second coil of a receiving end. The transmitting end generates a magnetic field, and the receiving end may generate energy through current induction or resonance according to a change in the magnetic field.

Wireless charging based on electromagnetic induction or magnetic resonance has recently been popular in electronic devices such as smartphones. When a power transmitting unit (PTU) (e.g., a wireless charging pad) and a power receiving unit (PRU) (e.g., a smartphone or Internet of things (IoT) device) come into contact or are located within a certain distance, the battery of the PRU may be charged by electromagnetic induction or electromagnetic resonance between a transmission coil of the PTU and a reception coil of the PRU.

When a foreign object (FO) (e.g., a metal object (MO)) exists between the PTU and the PRU during wireless charging, the temperature of the FO may increase due to the magnetic field generated between the PTU and the PRU, thereby causing a fire risk at the PTU and/or the PRU. The PTU may include a coil (hereinafter, referred to as a detection coil) for detecting the FO. The PTU may detect the presence or absence of the FO before and/or during wireless charging by means of the detection coil, and thus may not initiate wireless power transmission and/or discontinue the wireless power transmission, to prevent or reduce a fire risk in a wireless power system.

SUMMARY

In a wireless power transmission system in which pulsation is allowed (or generated), an existing wireless power transmission device flattens a low-voltage period of an input voltage in which pulsation is generated, and detects a foreign object (FO) in the flattened period. However, the existing wireless power transmission device should be provided with a separate direct current (DC) power supply for flattening the low-voltage period. To secure a stable time period with small errors and/or noise, the existing wireless power transmission device requires resources of a control circuit (e.g., a main control unit (MCU)) for accurately recognizing and controlling a low-voltage period, in addition to the DC power supply, and needs to use a complex algorithm for the recognition and the control. Accordingly, the existing wireless power transmission device should secure a control circuit capable of computing the complex algorithm and the resources of the control circuit in order to smoothly detect an FO.

Various embodiments may provide a wireless power transmission device capable of detecting an FO without using a DC power supply and/or a specific algorithm, and a method of operating the same in a wireless power transmission system in which pulsation is allowed (or generated).

According to various embodiments, a first electronic device for wirelessly transmitting power may include a power transmission circuit, memory, a pulse generator, a foreign object detection circuit configured to detect a foreign object located in a path in which power is wirelessly transmitted through the power transmission circuit, and a control circuit. The control circuit may be configured to wirelessly transmit power to a second electronic device, based on an alternating current (AC) input voltage applied to the power transmission circuit, generate a trigger signal synchronized with a first time corresponding to a specified voltage of the input voltage through the pulse generator, store, in the memory, an output value of the foreign object detection circuit identified at the first time based on the trigger signal, continuously obtain the output value stored in the memory from the memory during a specified time until before the trigger signal of a next period is received at the memory from the pulse generator, and detect the foreign object based on the output value obtained during the specified time.

According to various embodiments, a method of operating a first electronic device for wirelessly transmitting power may include wirelessly transmitting power to a second electronic device, based on an AC input voltage applied to a power transmission circuit included in the first electronic device, generating a trigger signal synchronized with a first time corresponding to a specified voltage of the input voltage through a pulse generator included in the first electronic device, storing an output value of a foreign object detection circuit included in the first electronic device and configured to output a foreign object in a path in which power is wirelessly transmitted in memory included in the first electronic device, the output value being identified at the first time based on the trigger signal, continuously obtaining the output value stored in the memory from the memory during a specified time until before the trigger signal of a next period is received at the memory from the pulse generator, and detecting the foreign object based on the output value obtained during the specified time.

According to various embodiments, a non-transitory recording medium may store a program configured to enable wirelessly transmitting power to a second electronic device, based on an AC input voltage applied to a power transmission circuit included in a first electronic device, generating a trigger signal synchronized with a first time corresponding to a specified voltage of the input voltage through a pulse generator included in the first electronic device, storing an output value of a foreign object detection circuit included in the first electronic device and configured to output a foreign object in a path in which power is wirelessly transmitted in memory included in the first electronic device, the output value being identified at the first time based on the trigger signal, continuously obtaining the output value stored in the memory from the memory during a specified time until before the trigger signal of a next period is received at the memory from the pulse generator, and detecting the foreign object based on the output value obtained during the specified time.

A wireless power transmission device according to various embodiments may detect a foreign object (FO) without using a direct current (DC) power supply and/or a specific algorithm in a wireless power transmission system in which pulsation is allowed (or generated).

DETAILED DESCRIPTION

Figure 1A:
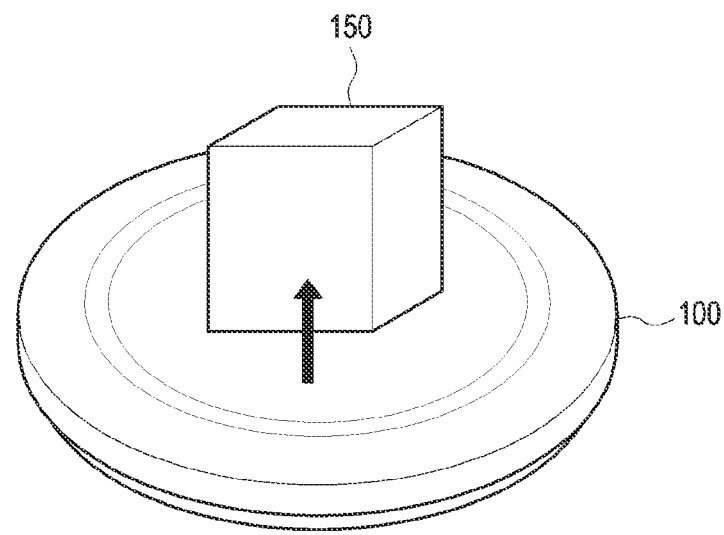
FIGS. 1A and 1B are diagrams illustrating a wireless power system including a wireless power transmission device and a wireless power reception device according to various embodiments.
Figure 1B:
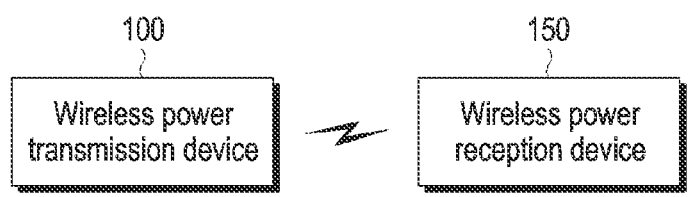
Figure 2:
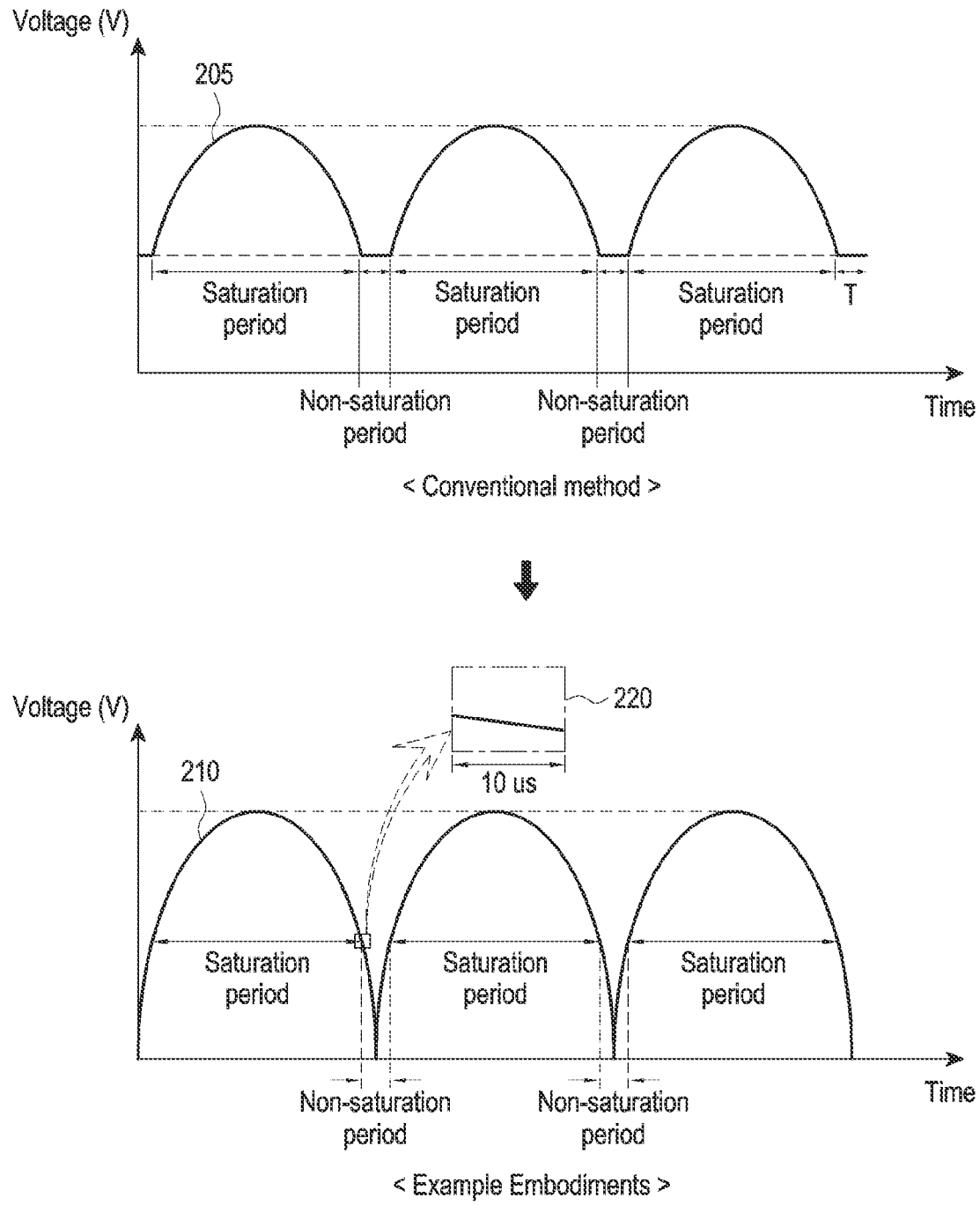
FIG. 2 is a diagram illustrating an operation of a wireless power transmission device according to various embodiments.

FIGS. 1A and 1B are diagrams illustrating a wireless power system including a wireless power transmission device and a wireless power reception device according to various embodiments. FIG. 2 is a diagram illustrating an operation of a wireless power transmission device according to various embodiments.

Referring to FIGS. 1A and 1B, according to various embodiments, a wireless power transmission (WPT) system may include a wireless power transmission device 100 that wirelessly transmits power, and a wireless power reception device 150. The wireless power transmission device 100 may wirelessly transmit power to the wireless power reception device 150. For example, as illustrated in FIG. 1B, the wireless power transmission device 100 may be implemented as a pad that wirelessly transmits power. Further, as illustrated in FIG. 1B, the wireless power reception device 150 may be implemented as an Internet of things (IoT) device.

However, the technical spirit of the disclosure may not be limited thereto, and the wireless power transmission device 100 and the wireless power reception device 150 may be implemented as electronic devices of various types in various shapes.

Referring to FIG. 2, according to various embodiments, when the wireless power transmission device 100 is not provided with a power factor correction circuit of a power input unit (e.g., a power supply 106 in FIG. 3) in the WPT system, voltage pulsation may occur in a specified frequency (e.g., 120 Hz) due to an input voltage (e.g., an alternating current (AC) voltage). The input voltage including the pulsation may cause the same pulsation in a current and a magnetic field of the wireless power transmission device 100 during wireless power transmission. In view of the pulsation in the current and magnetic field of the wireless power transmission device 100, a foreign object (FO) detector 120 (e.g., an FO detection coil 122 and an FO detection circuit 124 in FIG. 3) may be saturated and noise may be generated in the wireless power transmission device 100.

According to various embodiments, an existing wireless power transmission device may detect an FO in a low-voltage period (e.g. a non-saturation period) of an input voltage 205 in which pulsation is generated by flattening the period. However, the existing wireless power transmission device should be provided with a separate direct current (DC) power supply to flatten the low-voltage period. That is, the existing wireless power transmission device needs to apply separate DC power to secure a sufficiently long low-voltage period. To this end, the existing wireless power transmission device should secure a stable DC power supply using an AC/DC converter. To apply a DC voltage, the existing wireless power transmission device may instantaneously shift a driving frequency for wireless power transmission in the low-voltage period. For example, the existing wireless power transmission device may perform wireless power transmission at a frequency of 20 kHz in a high-voltage period and at a frequency of 80 kHz in a low-voltage period (e.g., a non-saturation period).

Moreover, the existing wireless power transmission device may need to use resources (e.g., input/output (JO) and interrupt consumption) of a control circuit (e.g., a main control unit (MCU)) capable of accurately recognizing and controlling a low-voltage period in addition to the DC power supply, in order to secure a stable time period (e.g., a non-saturation period) with small errors and/or noise. However, since the length (or duration) of the time period (e.g., the non-saturation period) may be changed according to the size and/or type of a load of a wireless power reception device, the wireless power transmission device may require a specific algorithm to appropriately recognize and control the duration of the time period (e.g., the non-saturation period). However, since the specific algorithm requires complex computations, it is necessary to secure the performance or resources of the control circuit.

The wireless power transmission device 100 according to various embodiments may detect an FO without using a DC power supply and/or a specific algorithm in the WPT system in which pulsation is allowed (or generated). For example, because the wireless power transmission device 100 does not apply a DC voltage, the wireless power transmission device 100 may not change the shape of an input voltage, compared to the existing wireless power transmission device. The wireless power transmission device 100 may identify and store an output value of the FO detector instantaneously (e.g., within a specified time 220 (e.g., 10 μs)) in a non-saturation period of an input voltage, and continuously provide the output value with a magnitude maintained as it is to the control circuit to detect an FO during the specified time. That is, the wireless power transmission device 100 may sample an instantaneously identified output of the FO detection circuit and detect an FO using a sampled output value.

Since there is no need to apply a DC voltage, the wireless power transmission device 100 according to various embodiments may not instantaneously shift a driving frequency for wireless power transmission in a low-voltage period. Further, the wireless power transmission device 100 according to various embodiments may reduce consumption of resources required to recognize the low-voltage period.

Figure 3:
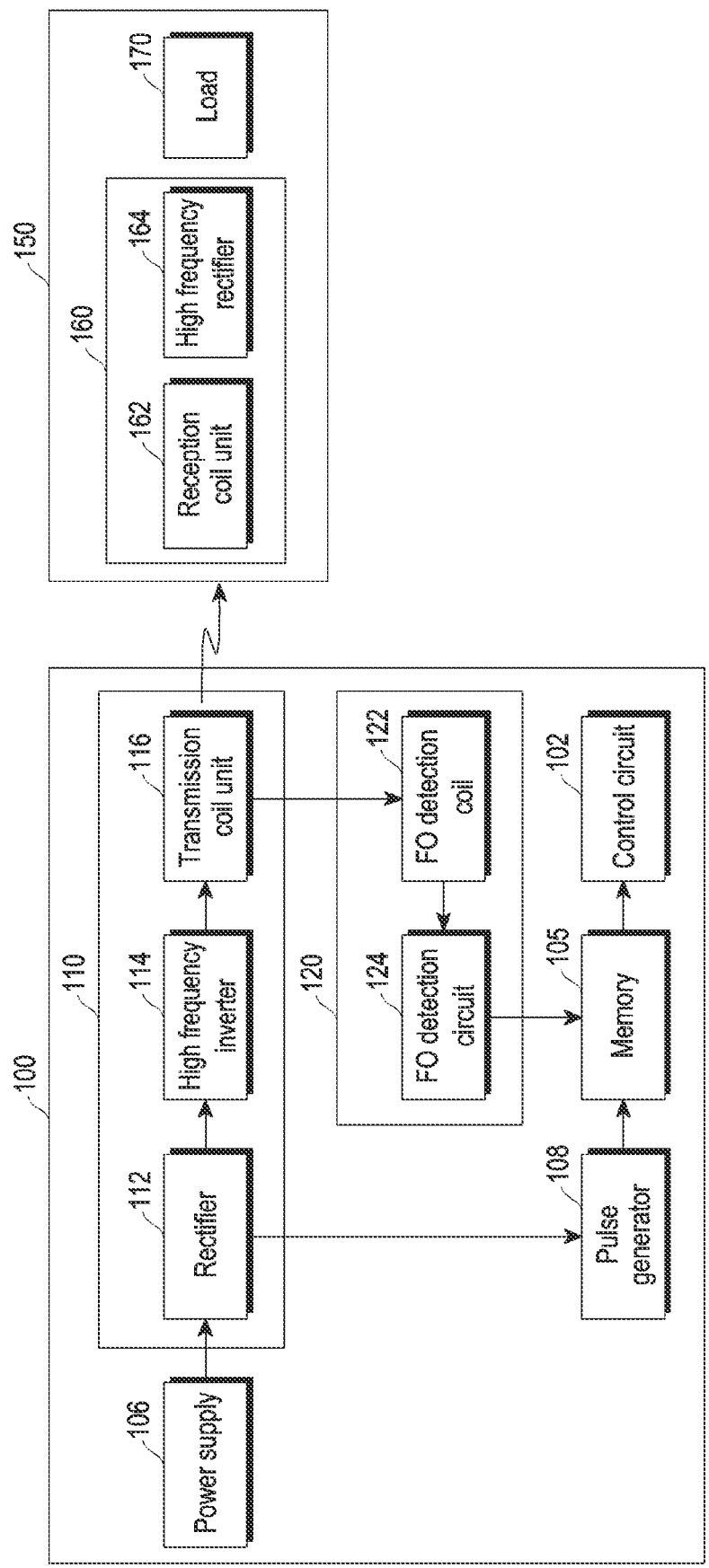
FIG. 3 is a schematic block diagram illustrating a wireless power system including a wireless power transmission device and a wireless power reception device according to various embodiments.
Figure 4:
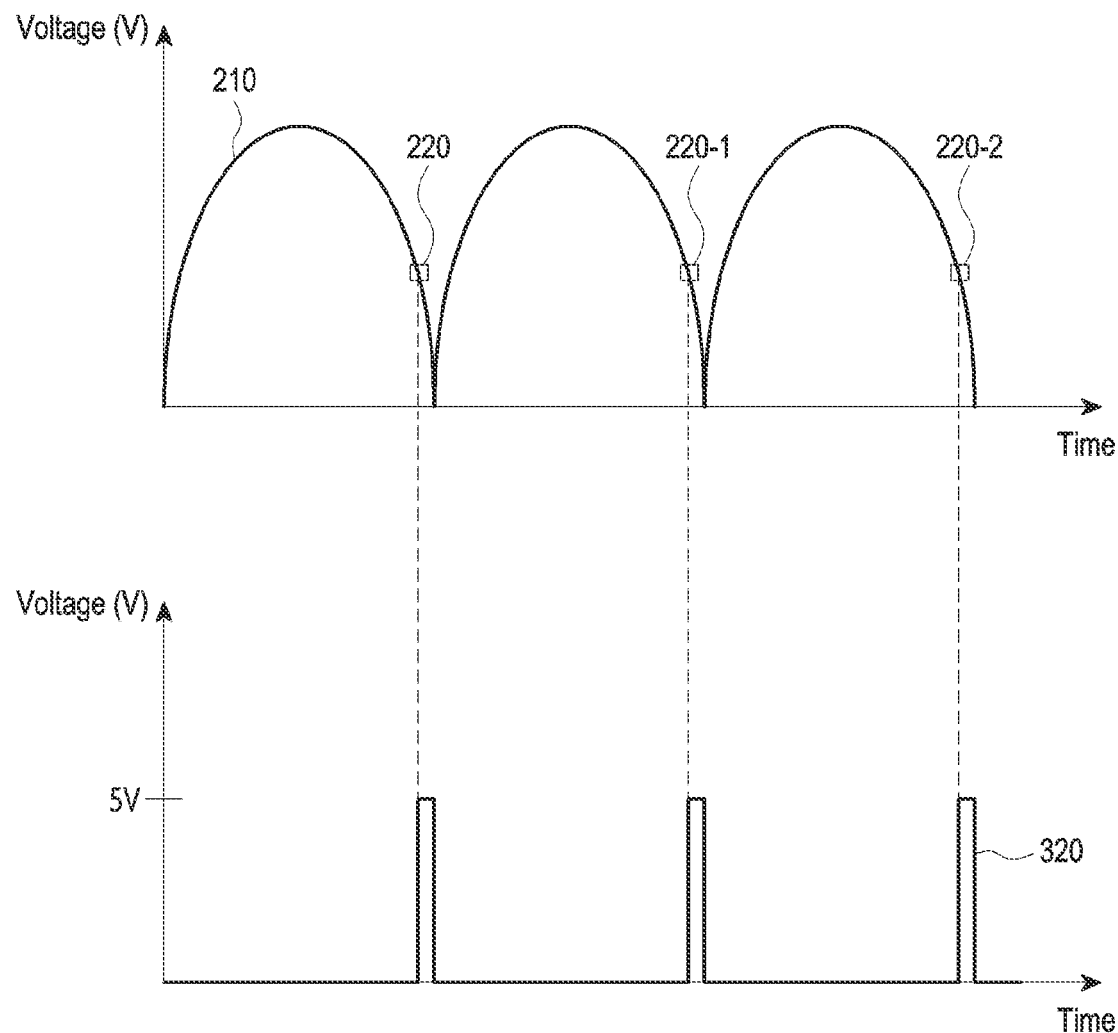
FIG. 4 is a diagram illustrating an operation of outputting a trigger signal by a pulse generator according to various embodiments.

FIG. 3 is a schematic block diagram illustrating a WPT system including a wireless power transmission device and a wireless power reception device according to various embodiments. FIG. 4 is a diagram illustrating an operation of outputting a trigger signal by a pulse generator according to various embodiments.

Referring to FIG. 3, according to various embodiments, the wireless power transmission device 100 may include a control circuit 102, memory 105, the power supply 106, a pulse generator 108, a power transmission circuit 110, and the FO detector 120. For example, the wireless power transmission device 100 may not include a separate AC/DC converter.

The wireless power reception device 150 according to various embodiments may include a power reception circuit 160 and a load 170. The wireless power reception device 150 may further include a processor (not shown), a communication circuit (not shown), a power management integrated circuit (PMIC) (not shown), and memory (not shown).

The power transmission circuit 110 according to various embodiments may wirelessly transmit power to the power reception circuit 160 according to at least one of an induction method, a resonance method, or an electromagnetic wave method.

According to various embodiments, the power transmission circuit 110 may include a rectifier 112, a high frequency inverter 114, and a transmission coil unit 116. The rectifier 112 may receive power from the power supply 106 and provide rectified power obtained by rectifying the received power to the high frequency inverter 114. The power supply 106 may, for example, receive power based on power supplied from a charger (e.g., a travel adapter (TA)) and transmit the received power to the high frequency inverter 114. The high frequency inverter 114 may amplify the received power and transmit the amplified power to the transmission coil unit 116. The transmission coil unit 116 may include a coil and a matching circuit. When power is applied to the coil of the transmission coil unit 116, an induced magnetic field changing in magnitude over time may be formed from the coil, and thus power may be wirelessly transmitted. The power transmission circuit 110 may further include capacitors forming a resonant circuit, together with the coil. A resonance frequency may be defined according to a standard, and may have a frequency of about 100 to about 205 kHz according to the Qi standard based on induction and a frequency of about 6.78 MHz according to the AFA standard based on resonance. The matching circuit may change at least one of the capacitance or the reactance of a circuit coupled to the coil under the control of the control circuit 102, for impedance matching between the power transmission circuit 110 and the power reception circuit 160.

According to various embodiments, the control circuit 102 may provide overall control to operations (e.g., a wireless power transmission operation) of the wireless power transmission device 100. For example, the control circuit 102 may be implemented as various circuits capable of performing computations, including a general-purpose processor such as a central processing unit (CPU), a mini computer, a microprocessor, a micro controlling unit (MCU), and a field programmable gate array (FPGA), and the type of the control circuit 102 is not limited. Each processor and controller herein may include processing circuitry.

According to various embodiments, the control circuit 102 may detect an FO located in a wireless power transmission path between the wireless power transmission device 100 and the wireless power reception device 150, based on a signal received from the FO detector 120.

According to various embodiments, the FO detector 120 may be, for example, a circuit for foreign object detection (FOD). For example, the FO detector 120 may include the FO detection coil 122 and the FO detection circuit 124.

According to various embodiments, the FO detection coil 122 may receive a signal (e.g., AC current) from the transmission coil unit 116 and transmit the received signal to the FO detection circuit 124. The FO detection circuit 124 may output the signal received from the FO detection coil 122 to the memory 105.

According to various embodiments, the memory 105 may store an output value received from the FO detection circuit 124. The memory 105 may output the stored signal to the control circuit 102 based on a signal (hereinafter, referred to as a trigger signal) output from the pulse generator 108. For example, the memory 105 may be implemented in various forms such as read only memory (ROM), random access memory (RAM), or flash memory, and the implementation form is not limited. For example, the memory 105 may include an opto-coupler.

According to various embodiments, the memory 105 may obtain and store an output value of the FO detection circuit 124 at an input time (e.g., see 220 in FIG. 2) of a specified voltage (e.g., a preset sufficiently low voltage) too low to saturate an output of the FO detection coil 122 and the FO detection circuit 124. For example, the memory 105 may obtain and store the output value of the FO detection circuit 124 at the time 220 at which the specified voltage is input. In this case, the output value of the FO detection circuit 124 may not or may scarcely be changed during a time period (e.g., 10 μs) during which the memory 105 obtains and stores the output value. The memory 105 may transmit the stored output value of the FO detection circuit 124 to the control circuit 102, while maintaining the output value until a next period of a trigger signal (e.g., se 320 in FIG. 4).

According to various embodiments, the pulse generator 108 may generate a pulse waveform synchronized with the input time of the specified voltage. Referring to FIG. 4, the pulse generator 108 may generate the signal 320 (hereinafter, referred to as the trigger signal) in a pulse waveform synchronized with specified low-voltage times 220, 220-1, and 220-2 of the input voltage, based on a rectified voltage 210 received from the rectifier 112. The pulse generator 108 may output the generated trigger signal 320 to the memory 105. For example, the pulse generator 108 may generate and output the trigger signal 320 at the times 220, 220-1, and 220-2 of the specified low voltage corresponding to a voltage too low to saturate the FO detection coil 122 and the FO detection circuit 124 in the rectified voltage 210 corresponding to the AC input voltage. The pulse generator 108 may generate and output the trigger signal 320 in a pulse waveform representing a high signal (e.g., a 5V signal) during a predetermined time (e.g., 10 µs) from the specified low-voltage times 220, 220-1, and 220-2, based on the rectified voltage which is output from the rectifier 112 and applied to the high frequency inverter 114. For example, the pulse generator 108 may generate and output the trigger signal 320 representing a high signal of the rectified voltage 210 corresponding to the AC input voltage at the specified low-voltage times 220, 220-1, and 220-2.

According to various embodiments, the control circuit 102 may perform a FO detection operation based on an output value provided from the memory 105. For example, the control circuit 102 may detect the FO located on the power transmission path based on an output value of the foreign material detection circuit 124 provided from the memory 105 until the memory 105 receives the next trigger signal 320 from the pulse generator 108.

According to various embodiments, the wireless power transmission device may further include a communication circuit (not shown). The communication circuit may include a plurality of communication circuits (e.g., a first communication circuit or a second communication circuit). For example, the first communication circuit may communicate with the wireless power reception device 150 based on an in-band communication method using a frequency that is the same as or adjacent to a frequency used for power transmission in the coil, and the second communication circuit may communicate with the wireless power reception device 150 based on an out-of-band communication method using a frequency different from the frequency used for power transmission in the coil.

The power reception circuit 160 according to various embodiments may wirelessly receive power from the power transmission circuit 110 according to at least one of the induction method, the resonance method, or the electromagnetic wave method. The power reception circuit 160 may perform power processing to rectify the received power of an AC waveform into power of a DC waveform, convert a voltage, or regulate power.

According to various embodiments, the power reception circuit 160 may include a reception coil unit 162 (including at least a coil) and a high frequency rectifier 164, as shown in FIG. 3. The power reception circuit 160 may further include a converting circuit and a matching circuit. In the reception coil unit 162, an induced electromotive force may be generated by a magnetic field changing in magnitude over time, formed around the reception coil unit 162, and accordingly, the power reception circuit 160 may receive power wirelessly. The high-frequency rectifier 164 may rectify the received power of the AC waveform. The converting circuit may adjust the voltage of the rectified power and transmit the power to a PMIC (not shown). The converting circuit may be included in the high frequency rectifier 164. The matching circuit may change at least one of the capacitance or the reactance of a circuit coupled to the coil under the control of the processor (not shown) of the wireless power reception device 150, for impedance matching between the power transmission circuit 110 and the power reception circuit 160.

According to various embodiments, the PMIC (not shown) of the wireless power reception device 150 may process the received and processed power to be suitable for hardware (e.g., the load 170), and may transmit the received and processed power to each hardware component. The load 170 may include, for example, a battery that stores power received from the wireless power transmission device 100, and include various types of hardware that consumes power.

According to various embodiments, the processor (not shown) of the wireless power reception device 150 may provide overall control to the wireless power reception device 150, generate various messages required for wireless power reception, and transmit the messages to the communication circuit (not shown). Instructions to perform an operation of the wireless power reception device 150 may be stored in the memory (not shown). The memory (not shown) may be implemented in various forms such as ROM, RAM, or flash memory, and the implementation form is not limited.

According to various embodiments, the wireless power transmission device 100 and/or the wireless power reception device 150 may include a sensing circuit (not shown). For example, the sensing circuit may detect whether the wireless power transmission device 100 and/or the wireless power reception device 150 has been coupled with another electronic device (e.g., the wireless power reception device 150 and/or the wireless power transmission device 100) using a magnetic field sensor, and detect the state of an output signal, for example, a current level, a voltage level, and/or a power level of the output signal, using a current (or voltage) sensor.

Figure 5:
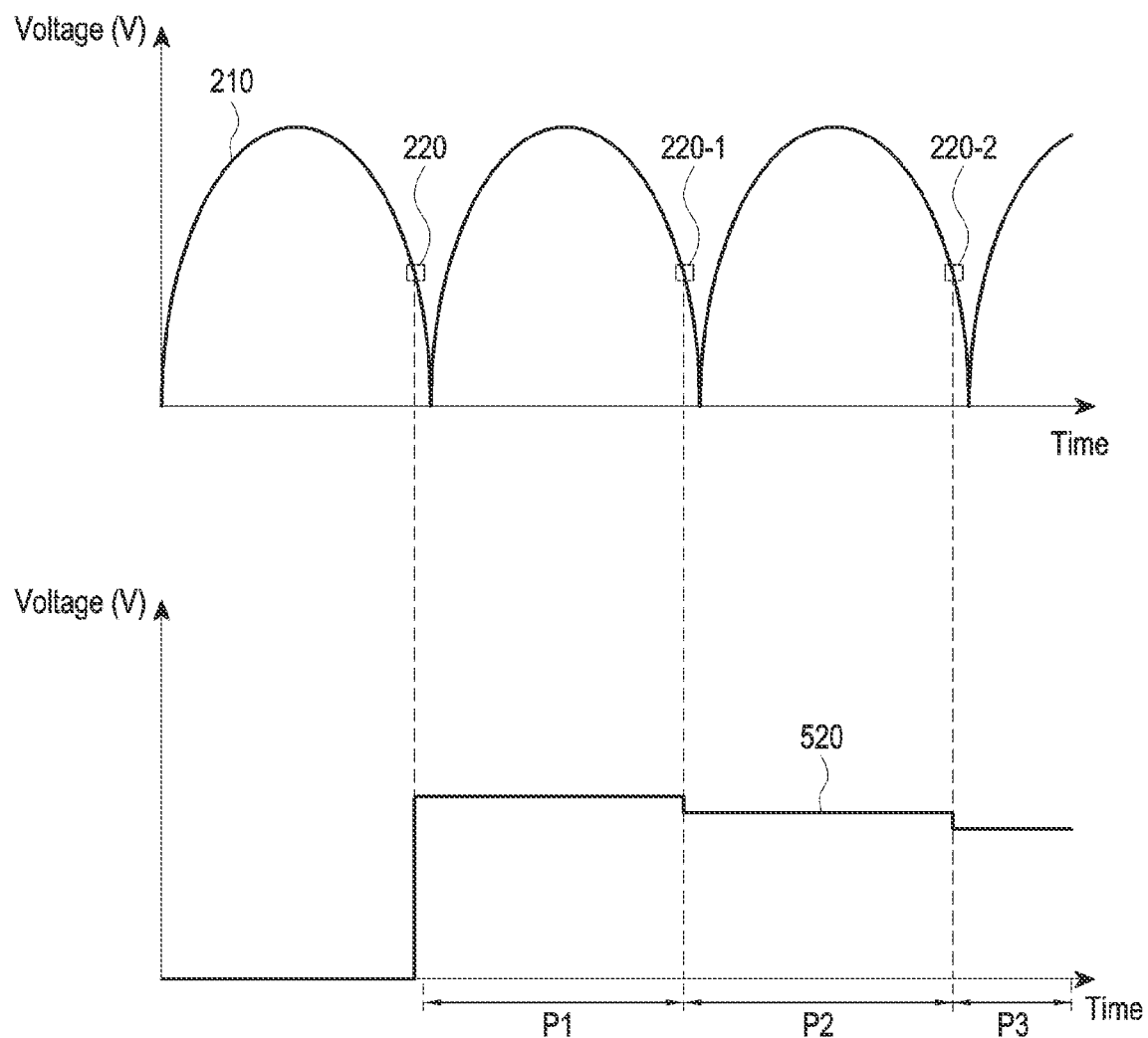
FIG. 5 is a diagram illustrating an operation of outputting a signal corresponding to an output value of a foreign object detection circuit by memory according to various embodiments.

FIG. 5 is a diagram illustrating an operation of outputting a signal corresponding to an output value of an FO detection circuit by memory according to various embodiments.

According to various embodiments, referring to FIGS. 4 and 5, the memory 105 may provide an output value 520 of the FO detection circuit 124 to the control circuit 102, based on the trigger signal 320 representing a high signal in a non-saturation period of the rectified voltage 210. For example, the memory 105 may provide a first output value of the FO detection circuit 124, which has been obtained and stored at a first time 220, to the control circuit 102 during a first time period P1 based on the trigger signal 320 of a first period. The memory 105 may output a second output value of the FO detection circuit 124, which has been obtained and stored at a second time 220-1, to the control circuit 102 during a second time period P2 based on the trigger signal 320 of a second period. The memory 105 may output a third output value of the FO detection circuit 124, which has been obtained and stored at a third time 220-2, to the control circuit 102 during a third time period P3 based on the trigger signal 320 of a third period. While the first output value, the second output value, and the third output value are shown as having different magnitudes in FIG. 5, this is only for convenience of description, which may not limit the technical spirit of the disclosure.

According to various embodiments, the control circuit 102 may perform an FO detection operation based on the first output value during the first time period P1, based on the second output value during the second time period P2, and based on the third output value during the third time period P3.

Figure 6:
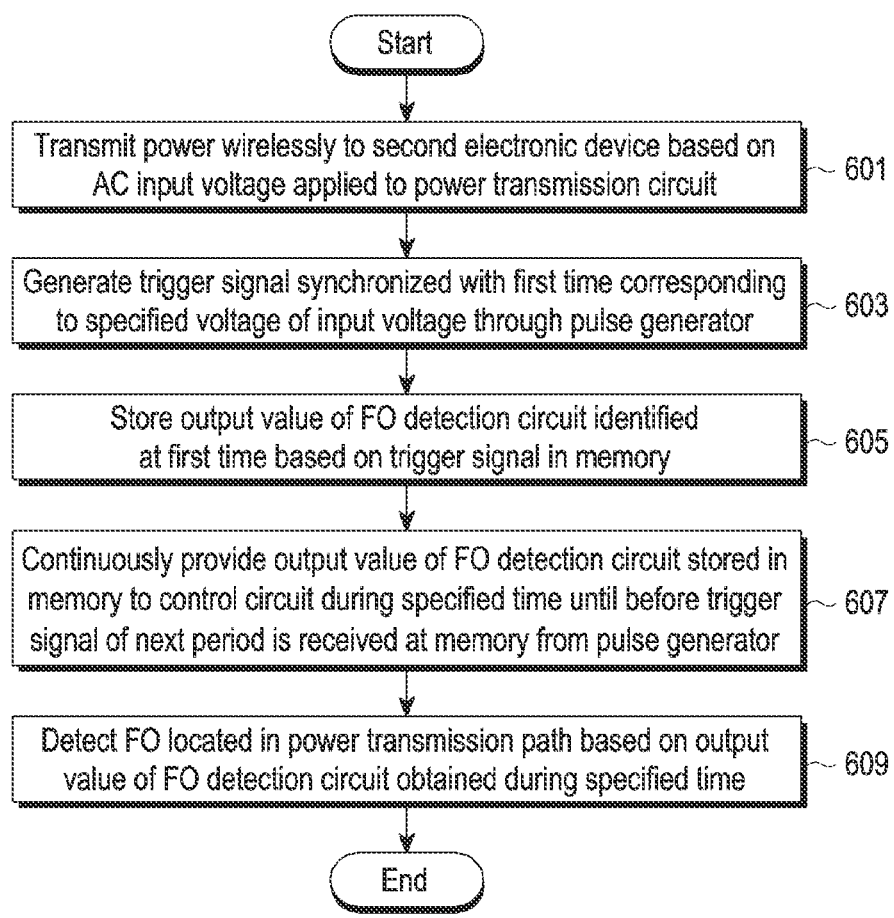
FIG. 6 is a flowchart illustrating an operation of a wireless power transmission device according to various embodiments.

FIG. 6 is a flowchart illustrating an operation of a wireless power transmission device according to various embodiments.

According to various embodiments, in operation 601, the wireless power transmission device 100 may wirelessly transmit power to a second electronic device, based on an AC input voltage applied to the power transmission circuit 110.

According to various embodiments, in operation 603, the wireless power transmission device 100 may generate, through the pulse generator 108, a trigger signal synchronized with a first time corresponding to a specified voltage (e.g., a low voltage at which the FO detection coil 122 and the FO detection circuit 124 are not saturated) within a non-saturation period of a rectified voltage corresponding to the input voltage. For example, the first time may include a time corresponding to a period in which an output of the FO detector 120 (e.g., the FO detection coil 122 and/or the FO detection circuit 124) is not saturated. For example, the first time may include a time corresponding to a specified low-voltage period of the input voltage. For example, the first time may be set by the control circuit 102 or set by a user.

According to various embodiments, in operation 605, the wireless power transmission device 100 may store an output value of the FO detection circuit 124 identified at the first time in the memory 105 based on the trigger signal.

According to various embodiments, in operation 607, the wireless power transmission device 100 may continuously provide the output value of the FO detection circuit 124 stored in the memory 105 (e.g., while maintaining the magnitudes of the output value) during a specified time, until before receiving the trigger signal of a next period from the pulse generator 108. For example, the specified time may be included in a time period until before the trigger signal of a next second period after reception of the trigger signal of a first period. For example, the wireless power transmission device 100 may sample the output value of the FO detection circuit 124, identified at the first time, store the sampled value in the memory 105, and provide the sampled output value to the control circuit 102 during the specified time, while maintaining the magnitude of the sampled output value. For example, the control circuit 102 may control the memory 105 to provide the output value of the FO detection circuit 124 to the control circuit 102 based on the trigger signal output from the pulse generator 108.

According to various embodiments, in operation 609, the wireless power transmission device 100 may detect an FO located in a power transmission path between the wireless power transmission device 100 and the wireless power reception device 150 based on the output value of the FO detection circuit.

According to various embodiments, the wireless power transmission device 100 may generate, through the pulse generator 108, a trigger signal synchronized with a time corresponding to a specified voltage other than the low voltage of the rectified voltage corresponding to the input voltage. For example, the time corresponding to the specified voltage which is not in the low-voltage period may be set by the control circuit 102 or set by the user. For example, the wireless power transmission device 100 may store, in the memory 105, an output value of the FO detection circuit 124 identified at the corresponding time based on the trigger signal synchronized with the time corresponding to the specified voltage. In addition, the wireless power transmission device 100 may sample the output value of the FO detection circuit 124 identified at the corresponding time, and provide the sampled output value to the control circuit 102, while maintaining the magnitude of the sampled output value.

Figure 7A:
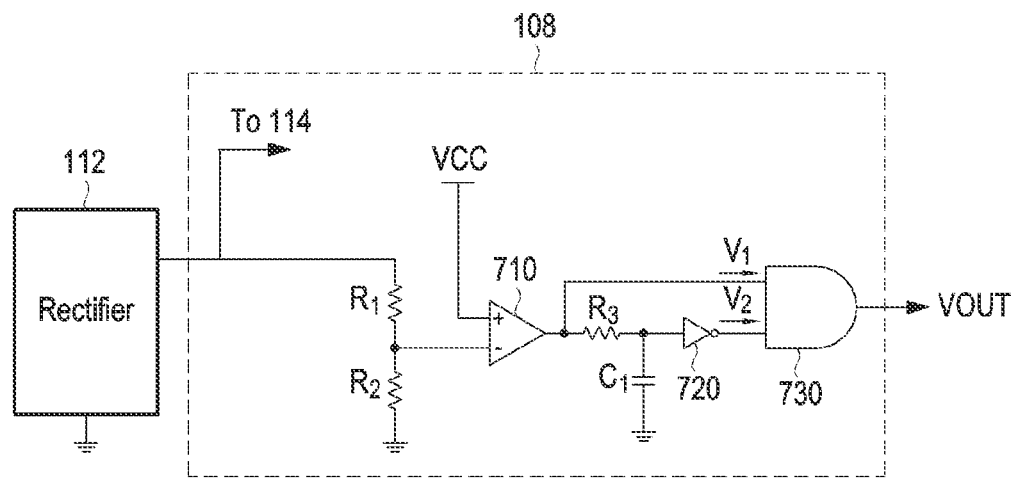
FIGS. 7A and 7B are diagrams illustrating a pulse generator according to various embodiments.
Figure 7B:
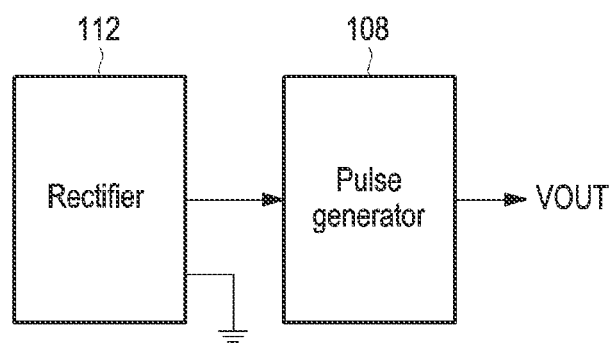
Figure 8:
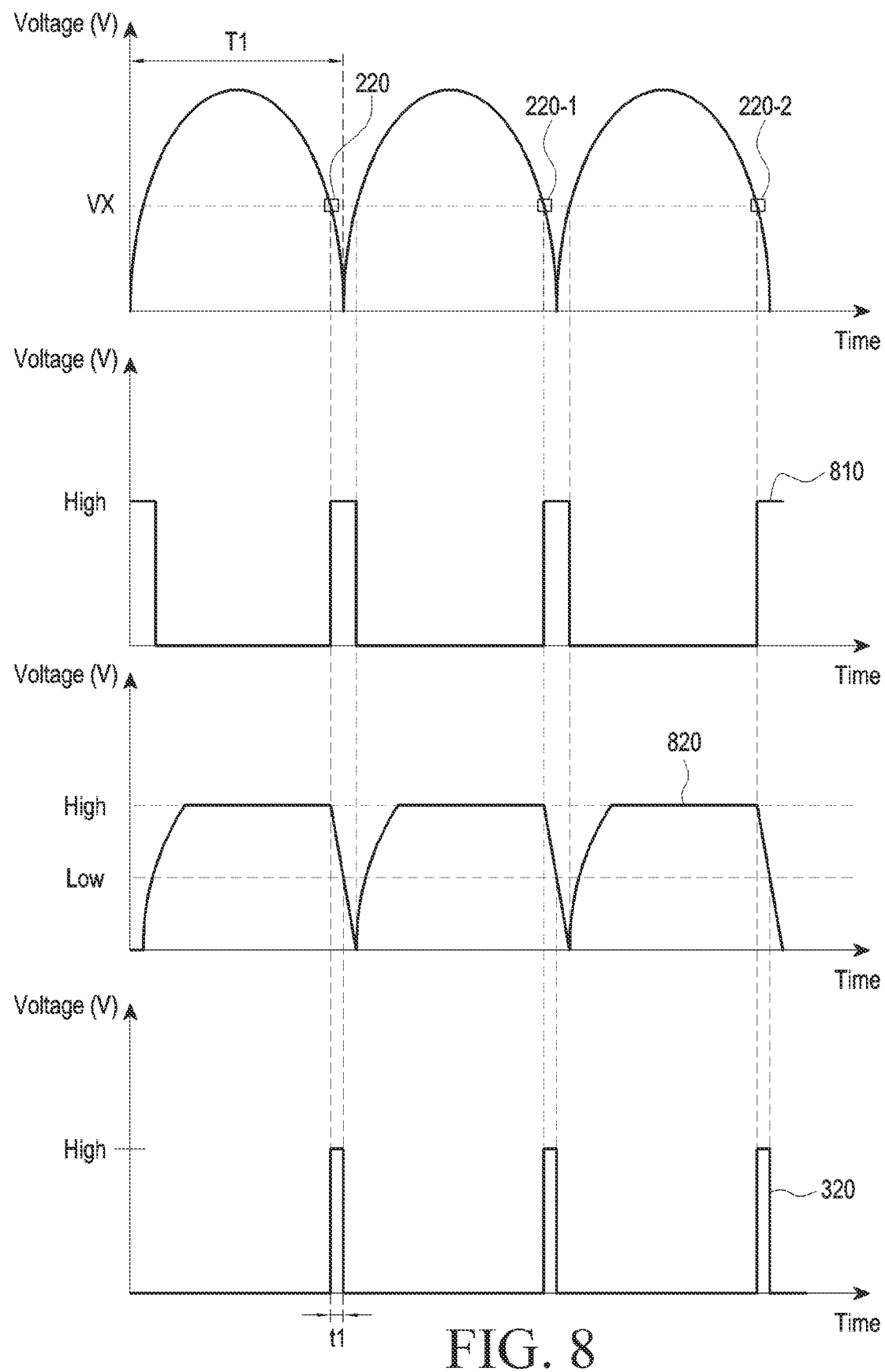
FIG. 8 is a diagram illustrating an operation of outputting a trigger signal by a pulse generator according to various embodiments.

FIGS. 7A and 7B are diagrams illustrating a pulse generator according to various embodiments. FIG. 8 is a diagram illustrating an operation of outputting a trigger signal by a pulse generator according to various embodiments. Referring to FIGS. 7A and 8, the pulse generator 108 may include a first element 710, a second element 720, and a third element 730. The pulse generator 108 may include a first resistor $R_1$, a second resistor $R_2$, a third resistor $R_3$, and a first capacitor $C_1$.

According to various embodiments, the first element 710 may output a first signal (e.g., see 810 in FIG. 8) based on a reference voltage VCC (e.g., 5V) and a voltage output from the rectifier 112. For example, the first element 710 may be implemented as a comparator. For example, the first element 710 may compare the reference voltage VCC with a voltage obtained by dividing the voltage output from the rectifier 112 by the first resistor $R_1$ and the second resistor $R_2$, and output a first signal $V_1$ or 810 according to a result of the comparison. For example, as illustrated in FIG. 8, when the voltage obtained by dividing the voltage output from the rectifier 112 by the first resistor $R_1$ and the second resistor $R_2$ is lower than the reference voltage VCC or VX, the first element 710 may output the first signal $V_1$ or 810 having a pulse width representing a high signal.

According to various embodiments, the second element 720 may output a second signal $V_2$ or 820 based on the reference voltage VCC and a voltage output from the rectifier 112. For example, the second element 720 may be implemented as an inverter. For example, as illustrated in FIG. 8, the second element 720 may receive a voltage obtained by dividing the first signal 810 by the third resistor $R_3$ and the first capacitor $C_1$, and output the second signal $V_2$ or 820. For example, a low voltage Low of the second signal 820 may be an input threshold voltage of the third element 730 (e.g., an AND gate).

According to various embodiments, the third element 730 may output a timing signal VOUT or 320 based on the first signal $V_1$ or 810 and the second signal $V_2$ or 820 output from the second element 720 (e.g., the inverter). For example, the third element 730 may be implemented as an AND gate. For example, the third element 730 may output the timing signal VOUT or 320 representing a high signal in a period in which both the first signal $V_1$ or 810 and the second signal $V_2$ or 820 are high. For example, the timing signal VOUT or 320 may have a specified pulse width t1 (e.g., 10 μs) representing a high signal. For example, the pulse width t1 (e.g., the pulse width representing the high signal) of the timing signal VOUT or 320 may be changed by adjusting a time constant of the third resistor $R_3$ and the first capacitor $C_1$. A time (or generation time) when the timing signal VOUT or 320 is generated may be a specified time (e.g., a low voltage point) in a voltage period in which the FO detection coil 122 and the FO detection circuit 124 are not saturated. For example, the generation time of the timing signal VOUT or 320 may be changed by adjusting a ratio between the first resistor $R_1$ and the second resistor $R_2$.

Referring to FIG. 7B, the pulse generator 108 may be implemented as various types of circuits. For example, the pulse generator 108 may be implemented as at least one of a digital circuit or an analog circuit. The pulse generator 108 may receive a voltage output from the rectifier 112 and output the timing signal VOUT or 320 based on the input voltage.

Figure 9A:
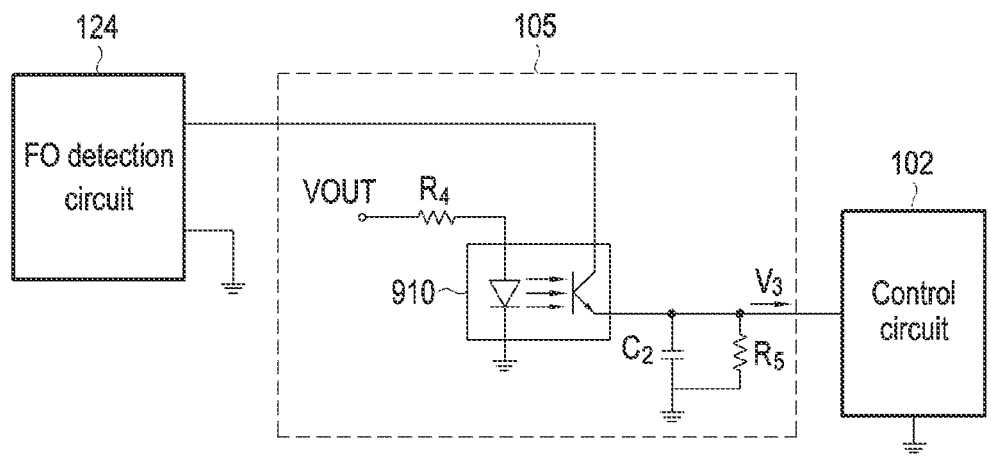
FIGS. 9A and 9B are diagrams illustrating memory according to various embodiments.
Figure 9B:
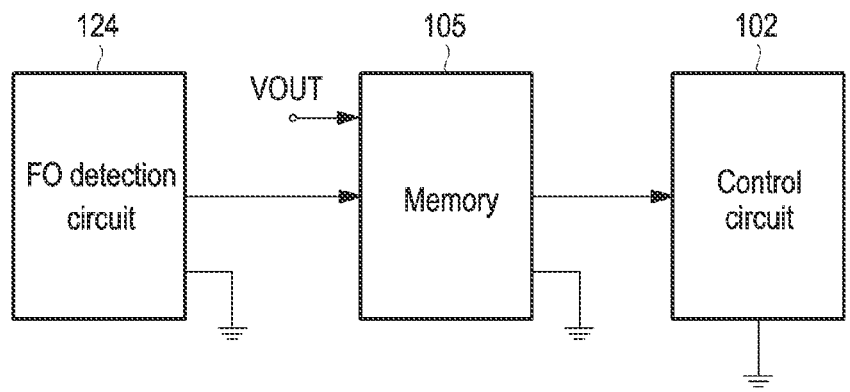

FIGS. 9A and 9B are diagrams illustrating memory according to various embodiments.

Referring to FIG. 9A, the memory 105 may include an opto-coupler 910. The memory 105 may further include a fourth resistor $R_4$, a fifth resistor $R_5$, and a second capacitor $C_2$.

Referring to FIG. 9A, the memory 105 may store an output value of the FO detection circuit 124 (e.g., current and voltage values input to the opto-coupler 910). The memory 105 may maintain the magnitude of a stored output value $V_3$ based on the trigger signal VOUT and provide the output value $V_3$ having the maintained magnitude to the control circuit 102 during a specified time. For example, the memory 105 may receive the trigger signal VOUT representing a high signal of a first period, and then provide the output value $V_3$ having the maintained magnitude to the control circuit 102 until before receiving the trigger signal VOUT representing a high signal of a second period following the first period. For example, the memory 105 may output the output value $V_3$ to the control circuit 102, while maintaining the magnitude of the output value $V_3$ during the specified time, as illustrated in FIG. 4. For example, the fourth resistor $R_4$ may be changed to adjust a current (or the magnitude of the current) input to the opto-coupler 910.

According to various embodiments, a time constant of the fifth resistor $R_5$ and the second capacitor $C_2$ may be set to be greater than one period T1 of an input voltage (e.g., a rectified signal). For example, the time constant of the fifth resistor $R_5$ and the second capacitor $C_2$ may be set large enough to provide the output value $V_3$ stored in the memory or opto-coupler (910) to the control circuit 102, while maintaining the magnitude of the output value $V_3$. For example, the time constant of the fifth resistor $R_5$ and the second capacitor $C_2$ may be set to be 5 to 10 times greater than the one period T1 of the input voltage (e.g., the rectified signal).

Referring to FIG. 9B, the memory 105 may be implemented as various types of circuits. For example, the memory 105 may be implemented as at least one of a digital circuit or an analog circuit. The memory 105 may store an output value (e.g., $V_3$) of the FO detection circuit 124, and provide the stored output value (e.g., $V_3$) to the control circuit 102 according to the timing signal VOUT or 320 during the specified time, while maintaining the magnitude of the stored output value (e.g., $V_3$).

Each embodiment herein may be used in combination with any other embodiment herein.

The wireless power transmission device 100 according to various embodiments may be implemented identically or similarly to the electronic device 1001 of FIG. 10 to be described below.

Figure 10:
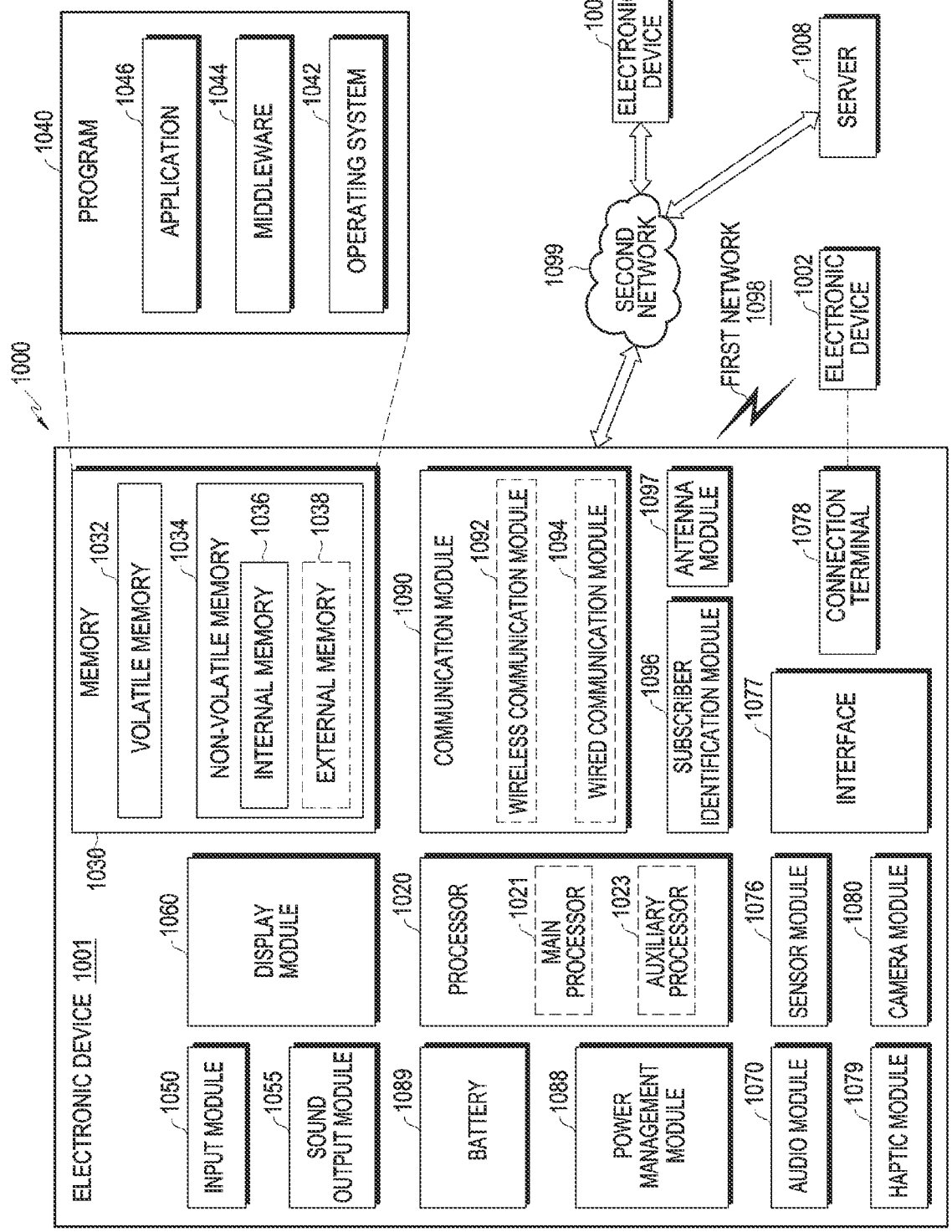
FIG. 10 is a block diagram illustrating an electronic device in a network environment according to various embodiments.

FIG. 10 is a block diagram illustrating an electronic device 1001 in a network environment 1000 according to various embodiments.

Referring to FIG. 10, the electronic device 1001 in the network environment 1000 may communicate with an electronic device 1002 via a first network 1098 (e.g., a short-range wireless communication network), or at least one of an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input module 1050, a sound output module 1055, a display module 1060, an audio module 1070, a sensor module 1076, an interface 1077, a connecting terminal 1078, a haptic module 1079, a camera module 1080, a power management module 1088, a battery 1089, a communication module 1090, a subscriber identification module (SIM) 1096, or an antenna module 1097. In some embodiments, at least one of the components (e.g., the connecting terminal 1078) may be omitted from the electronic device 1001, or one or more other components may be added in the electronic device 1001. In some embodiments, some of the components (e.g., the sensor module 1076, the camera module 1080, or the antenna module 1097) may be implemented as a single component (e.g., the display module 1060).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may store a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), or an auxiliary processor 1023 (e.g., a graphics processing unit (GPU), a neural processing unit (NPU), an image signal processor (ISP), a sensor hub processor, or a communication processor (CP)) that is operable independently from, or in conjunction with, the main processor 1021. For example, when the electronic device 1001 includes the main processor 1021 and the auxiliary processor 1023, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display module 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023. According to an embodiment, the auxiliary processor 1023 (e.g., the neural processing unit) may include a hardware structure specified for artificial intelligence model processing. An artificial intelligence model may be generated by machine learning. Such learning may be performed, e.g., by the electronic device 1001 where the artificial intelligence is performed or via a separate server (e.g., the server 1008). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input module 1050 may receive a command or data to be used by another component (e.g., the processor 1020) of the electronic device 1001, from the outside (e.g., a user) of the electronic device 1001. The input module 1050 may include, for example, a microphone, a mouse, a keyboard, a key (e.g., a button), or a digital pen (e.g., a stylus pen).

The sound output module 1055 may output sound signals to the outside of the electronic device 1001. The sound output module 1055 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1060 may visually provide information to the outside (e.g., a user) of the electronic device 1001. The display module 1060 may include, for example, a display, a hologram device, or a projector and control circuitry to control a corresponding one of the display, hologram device, and projector. According to an embodiment, the display module 1060 may include a touch sensor adapted to detect a touch, or a pressure sensor adapted to measure the intensity of force incurred by the touch.

The audio module 1070 may convert a sound into an electrical signal and vice versa. According to an embodiment, the audio module 1070 may obtain the sound via the input module 1050, or output the sound via the sound output module 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, a SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to one embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The wireless communication module 1092 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1092 may support a high-frequency band (e.g., the mmWave band) to achieve, e.g., a high data transmission rate. The wireless communication module 1092 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1092 may support various requirements specified in the electronic device 1001, an external electronic device (e.g., the electronic device 1004), or a network system (e.g., the second network 1099). According to an embodiment, the wireless communication module 1092 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1097 may transmit or receive a signal or power to or from the outside (e.g., the external electronic device) of the electronic device 1001. According to an embodiment, the antenna module 1097 may include an antenna including a radiating element composed of a conductive material or a conductive pattern formed in or on a substrate (e.g., a printed circuit board (PCB)). According to an embodiment, the antenna module 1097 may include a plurality of antennas (e.g., array antennas). In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

According to various embodiments, the antenna module 1097 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an interperipheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 or 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, mobile edge computing (MEC), or client-server computing technology may be used, for example. The electronic device 1001 may provide ultra low-latency services using, e.g., distributed computing or mobile edge computing. In another embodiment, the external electronic device 1004 may include an internet-of-things (IoT) device. The server 1008 may be an intelligent server using machine learning and/or a neural network. According to an embodiment, the external electronic device 1004 or the server 1008 may be included in the second network 1099. The electronic device 1001 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", or "connected to" another element (e.g., a second element), it means that the element may be coupled with the other element directly (e.g., wiredly), wirelessly, or via at least a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added. Each "module" herein may comprise circuitry.

According to various embodiments, a first electronic device 100 for wirelessly transmitting power may include a power transmission circuit, memory, a pulse generator, a foreign object detection circuit configured to detect a foreign object located in a path in which power is wirelessly transmitted through the power transmission circuit, and a control circuit. The control circuit may be configured to wirelessly transmit power to a second electronic device 150, based on an AC input voltage applied to the power transmission circuit, generate a trigger signal synchronized with a first time corresponding to a specified voltage of the input voltage through the pulse generator, store, in the memory, an output value of the foreign object detection circuit identified at the first time based on the trigger signal, continuously obtain the output value stored in the memory from the memory during a specified time until before the trigger signal of a next period is received at the memory from the pulse generator, and detect the foreign object based on the output value obtained during the specified time.

According to various embodiments, a magnitude of the output value provided through the memory may be maintained during the specified time.

According to various embodiments, the specified time may be included in a time period until before the trigger signal of a second period following a first period is received at the memory after the trigger signal of the first period is received from the pulse generator.

According to various embodiments, the first time may include a time corresponding to a period in which an output of the foreign object detection circuit is not saturated.

According to various embodiments, the first time may include a time corresponding to a specified low-voltage period of the input voltage.

According to various embodiments, the memory may include an opto-coupler, at least one resistor, and a capacitor.

According to various embodiments, a time constant of the resistor and the capacitor may be greater than one period of the input voltage.

According to various embodiments, the trigger signal may include a high signal of a specified pulse width synchronized with the first time.

According to various embodiments, the control circuit may be configured to generate the trigger signal at the first time through the pulse generator.

According to various embodiments, the control circuit may be configured to control the memory to provide the output value to the control circuit, based on the trigger signal output from the pulse generator.

According to various embodiments, a method of operating the first electronic device 100 for wirelessly transmitting power may include wirelessly transmitting power to the second electronic device 150, based on an AC input voltage applied to a power transmission circuit included in the first electronic device, generating a trigger signal synchronized with a first time corresponding to a specified voltage of the input voltage through a pulse generator included in the first electronic device, storing an output value of a foreign object detection circuit included in the first electronic device and configured to output a foreign object in a path in which power is wirelessly transmitted in memory included in the first electronic device, the output value being identified at the first time based on the trigger signal, continuously obtaining the output value stored in the memory from the memory during a specified time until before the trigger signal of a next period is received at the memory from the pulse generator, and detecting the foreign object based on the output value obtained during the specified time.

According to various embodiments, a magnitude of the output value provided through the memory may be maintained during the specified time.

According to various embodiments, the specified time may be included in a time period until before the trigger signal of a second period following a first period is received at the memory after the trigger signal of the first period is received from the pulse generator.

According to various embodiments, the first time may include a time corresponding to a period in which an output of the foreign object detection circuit is not saturated.

According to various embodiments, the first time may include a time corresponding to a specified low-voltage period of the input voltage.

According to various embodiments, the memory may include an opto-coupler, at least one resistor, and a capacitor.

According to various embodiments, a time constant of the resistor and the capacitor may be greater than one period of the input voltage.

According to various embodiments, the trigger signal may include a high signal of a specified pulse width synchronized with the first time.

According to various embodiments, generating the trigger signal may include generating the trigger signal at the first time through the pulse generator.

According to various embodiments, a non-transitory recording medium may store a program configured to enable wirelessly transmitting power to a second electronic device, based on an AC input voltage applied to a power transmission circuit included in the first electronic device 100, generating a trigger signal synchronized with a first time corresponding to a specified voltage of the input voltage through a pulse generator included in the first electronic device, storing an output value of a foreign object detection circuit included in the first electronic device and configured to output a foreign object in a path in which power is wirelessly transmitted in memory included in the first electronic device, the output value being identified at the first time based on the trigger signal, continuously obtaining the output value stored in the memory from the memory during a specified time until before the trigger signal of a next period is received at the memory from the pulse generator, and detecting the foreign object based on the output value obtained during the specified time.

What is claimed is:

1. A first electronic device for wirelessly transmitting power, comprising:
   a power transmission circuit;
   memory;
   a pulse generator;
   a foreign object detection circuit configured to detect a foreign object located in a path in which power is wirelessly transmitted through the power transmission circuit; and
   a control circuit,
   wherein the control circuit is configured to:
      wirelessly transmit power to a second electronic device, based on an alternating current (AC) input voltage applied to the power transmission circuit,
      generate a trigger signal synchronized with a first time corresponding to a specified voltage of the input voltage through the pulse generator,
      store, in the memory, an output value of the foreign object detection circuit identified at the first time based on the trigger signal,
      continuously obtain the output value stored in the memory from the memory during a specified time until before the trigger signal of a next period is received at the memory from the pulse generator, and
      detect the foreign object based on the output value obtained during the specified time.

2. The first electronic device of claim 1, wherein a magnitude of the output value provided through the memory is maintained during the specified time.

3. The first electronic device of claim 1, wherein the specified time is included in a time period until before the trigger signal of a second period following a first period is received at the memory after the trigger signal of the first period is received from the pulse generator.

4. The first electronic device of claim 1, wherein the first time includes a time corresponding to a period in which an output of the foreign object detection circuit is not saturated.

5. The first electronic device of claim 4, wherein the first time includes a time corresponding to a specified low-voltage period of the input voltage.

6. The first electronic device of claim 1, wherein the memory includes an opto-coupler, at least one resistor, and a capacitor.

7. The first electronic device of claim 6, wherein a time constant of the resistor and the capacitor is greater than one period of the input voltage.

8. The first electronic device of claim 1, wherein the trigger signal includes a high signal of a specified pulse width synchronized with the first time.

9. The first electronic device of claim 1, wherein the control circuit is configured to generate the trigger signal at the first time through the pulse generator.

10. The first electronic device of claim 1, wherein the control circuit is configured to control the memory to provide the output value to the control circuit, based on the trigger signal output from the pulse generator.

11. A method of operating a first electronic device for wirelessly transmitting power, the method comprising:
   wirelessly transmitting power to a second electronic device, based on an alternating current (AC) input voltage applied to a power transmission circuit included in the first electronic device;
   generating a trigger signal synchronized with a first time corresponding to a specified voltage of the input voltage through a pulse generator included in the first electronic device;
   storing, in memory included in the first electronic device, an output value of a foreign object detection circuit included in the first electronic device and configured to detect a foreign object located in a path in which power is wirelessly transmitted, the output value being identified at the first time based on the trigger signal;
   continuously obtaining the output value stored in the memory from the memory during a specified time until before the trigger signal of a next period is received at the memory from the pulse generator; and
   detecting the foreign object based on the output value obtained during the specified time.

12. The method of claim 11, wherein a magnitude of the output value provided through the memory is maintained during the specified time.

13. The method of claim 11, wherein the specified time is included in a time period until before the trigger signal of a second period following a first period is received at the memory after the trigger signal of the first period is received from the pulse generator.

14. The method of claim 11, wherein the first time includes a time corresponding to a period in which an output of the foreign object detection circuit is not saturated.

15. The method of claim 14, wherein the first time includes a time corresponding to a specified low-voltage period of the input voltage.

16. The method of claim 11, wherein the memory includes an opto-coupler, at least one resistor, and a capacitor.

17. The method of claim 16, wherein a time constant of the resistor and the capacitor is greater than one period of the input voltage.

18. The method of claim 11, wherein the trigger signal includes a high signal of a specified pulse width synchronized with the first time.

19. The method of claim 11, wherein generating the trigger signal comprises generating the trigger signal at the first time through the pulse generator.

20. A non-transitory computer-readable storage medium storing a program that, when executed by a processor, causes the processor to perform a method, comprising:
 wirelessly transmitting power to a second electronic device, based on an alternating current (AC) input voltage applied to a power transmission circuit included in a first electronic device;
 generating a trigger signal synchronized with a first time corresponding to a specified voltage of the input voltage through a pulse generator included in the first electronic device;
 storing, in memory included in the first electronic device, an output value of a foreign object detection circuit included in the first electronic device and configured to detect a foreign object located in a path in which power is wirelessly transmitted, the output value being identified at the first time based on the trigger signal;
 continuously obtaining the output value stored in the memory from the memory during a specified time until before the trigger signal of a next period is received at the memory from the pulse generator; and
 detecting the foreign object based on the output value obtained during the specified time.

* * * * *